(12) United States Patent
Lee

(10) Patent No.: US 6,737,321 B2
(45) Date of Patent: May 18, 2004

(54) METHOD OF MANUFACTURING FLASH MEMORY DEVICE

(75) Inventor: Min Kyu Lee, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/310,145

(22) Filed: Dec. 5, 2002

(65) Prior Publication Data

US 2003/0216002 A1 Nov. 20, 2003

(30) Foreign Application Priority Data

May 17, 2002 (KR) .................. 10-2002-0027485

(51) Int. Cl.⁷ .......................................... H01L 21/8247
(52) U.S. Cl. ...................... 438/264; 438/296; 438/426
(58) Field of Search ................. 438/257, 259, 438/264, 596, 426

(56) References Cited

U.S. PATENT DOCUMENTS 6,001,687 A * 12/1999 Chu et al. ................. 438/296
6,153,494 A * 11/2000 Hsieh et al. ............... 438/296
6,531,359 B1 * 3/2003 Tempel et al. ............. 438/257
6,638,822 B2 * 10/2003 Chang ...................... 438/264

* cited by examiner

Primary Examiner—Chandra Chaudhari
(74) Attorney, Agent, or Firm—Jacobson Holman PLLC

(57) ABSTRACT

The present invention relates to a method of manufacturing a flash memory device using a shallow trench isolation process and a self-aligned source etch process. A plurality of isolating cell isolation films are formed by means of the shallow trench isolation process so that an active region is defined between sources and sources in each of unit cells. Thus, trenches are not formed in a common source line between the isolating cell isolation films and portions of the common source line between the isolating cell isolation films are overlapped with word lines like in the sources of the unit cells. Thus, an electrical characteristic of the common source line can be uniformly kept. The productivity and yield of the device can be improved due to simplified process. Also, the width of the common source line is reduced and the level of integration in the semiconductor device can be increased.

29 Claims, 12 Drawing Sheets

METHOD OF MANUFACTURING FLASH MEMORY DEVICE

BACKGROUND OF THE INVENTION

1. Field of the Invention

The invention relates generally to a method of manufacturing a flash memory device, and more particularly to, a method of manufacturing a flash memory device using a shallow trench isolation (STI) process and a self-aligned source (SAS) etch process.

2. Description of the Prior Art

Generally, a common source line of a flash EEPROM is formed by means of a tungsten local interconnection (WLI) process or a self-aligned source (SAS) etch process. It is considered that the tungsten local interconnection (WLI) process is inadequate in applying it to higher-integrated devices since a contact margin must be considered. The self-aligned source etch process is thus widely used in order to realize higher-integration of the device.

In the method of manufacturing the flash memory device using the self-aligned source etch process, the common source line is formed by the self-aligned etch process for removing a cell isolation film existing between sources of an unit cell and an impurity ion implantation process for connecting neighboring sources. The cell isolation film may be formed by various methods. However, in order to increase the level of integration in the semiconductor device, the cell isolation film is recently formed by a shallow trench isolation (STI) process. A conventional method of manufacturing the flash memory device using the shallow trench isolation process and the self-aligned source etch process will be below described.

FIG. 1 is a layout diagram of the flash memory cell for explaining the conventional method of manufacturing the flash memory device, FIG. 2A through FIG. 2D are cross sectional views of the flash memory devices taken along line 2–2' in FIG. 1, FIG. 3A through FIG. 3D are cross sectional views of the flash memory devices taken along line 3–3' in FIG. 1, and FIG. 4A through FIG. 4D are cross sectional views of the flash memory devices taken along line 4–4' in FIG. 1.

Referring now to FIG. 1, FIG. 2A, FIG. 3A and FIG. 4A, a pad oxide film 12 and a pad nitride film 14 are sequentially formed on a semiconductor substrate 10 and are then patterned. A plurality of straight trenches 16 are formed in the semiconductor substrate 10 through the shallow trench isolation (STI) process using the patterned pad oxide film 12 and the pad nitride film 14 as an etch mask. After a wall oxidation process is performed, a gap fill oxide film 18 is formed so that the plurality of the straight trenches 16 are sufficiently buried.

By reference to FIG. 1, FIG. 2B, FIG. 3B and FIG. 4B, the gap fill oxide film 18 is planarized by means of a chemical mechanical polishing (CMP) process until the pad nitride film 14 is exposed. The planarized pad nitride film 14 and the pad oxide film 12 are removed to leave the gap fill oxide film 18 only at the straight trenches, so that a plurality of the straight cell isolation films 18T are formed. As the straight cell isolation films 18T are formed, a plurality of active regions are defined in the same direction to the straight cell isolation films 18T. After an ion implantation process for controlling the threshold voltage is performed, tunnel oxide films 20 are formed on the semiconductor substrate 10 in the active regions. Conductive layers 22 for the floating gate are then formed on the entire structure on which the tunnel oxide films 20 are formed. Next, the conductive layers 22 for the floating gate are patterned by means of an etch process using the floating gate mask.

Referring to FIG. 1, FIG. 2C, FIG. 3C and FIG. 4C, a dielectric film 24, a conductive layer 26 for a control gate, and a hard mask layer 28 are sequentially formed on the entire structure including the patterned conductive layers 22 for the floating gate. The conductive layers 26 for the control gate are then patterned by an etch process using a mask for the control gate, so that a plurality of control gates 26G being the word lines are formed in a direction intersecting the straight cell isolation films 18T. Next, the exposed portions of the patterned conductive layers 22 for the floating gate are etched by the self-aligned etch process. Thereby, a plurality of floating gates 22G each of which exists every unit cell while overlapping with the control gates 26G, respectively, are formed.

Referring to FIG. 1, FIG. 2D, FIG. 3D and FIG. 4D, the exposed portions of the straight cell isolation films 18T are removed by the self-aligned source etch process. Thereby, a plurality of recesses 30 are formed in the semiconductor substrate 10 as shown in FIG. 4D. An impurity ion is implanted into the exposed portions of the semiconductor substrate 10 through a cell source/drain implantation process. Thus, respective drains 32 are formed every unit cell and a common source line 34 sharing the plurality of the cells is formed.

In the cell of the flash memory device, erase or program operations are performed by injecting electrons into the floating gate through Fowler-Nordheim tunneling or hot carrier injection. In order for the cell to operate, independent word lines, bit lines, the common source line and the sub-line are necessary. In order to increase the level of integration in the semiconductor device, the cell size is shrunken by reducing the width of the line. Though the chip size is decided depending on the degree that the width of the line is reduced, the cell characteristic is degraded if the width of the line is too reduced. Thus, there is a limit in increasing the level of integration in the semiconductor device. In particular, if the common source line is formed by the shallow trench isolation (STI) process as in the conventional method, an electrical characteristic of the common source line is affected by the shape of the trench. Thus, in order to form the trench that is uniform and has an adequate shape to the common source line, the process of forming the trench is very difficult. Further, an over-etch process is necessarily required in order to completely remove oxide filled in the trench by the self-aligned source etch process. The surface of the semiconductor substrate, the tunnel oxide film, the gate, and the like are damaged due to excess over etch. Due to this, there are problems that the electrical characteristic and reliability of the flash memory device are degraded. In addition, an impurity ion is implanted into the recess from which the straight cell isolation film is removed, thus forming the common source line is formed by implanting. In this case, there is a limit in reducing the width of the common source line due to an electrical characteristic. There is a difficulty in increasing the level of integration in the device.

SUMMARY OF THE INVENTION

The present invention is contrived to solve the above problems and an object of the present invention is to provide a method of manufacturing a flash memory device that can uniformly maintain an electrical characteristic of a common source line, improve the productivity and yield of the device due to simplified process and reduce the cell size. To this end, a plurality of isolating cell isolation films are formed by a shallow trench isolation process so that active regions are defined between sources and sources in respective unit cells. Thus, trenches are not formed at a common source line portion between the isolating cell isolation films, and portions of the common source lines between the isolating cell isolation films are overlapped with word lines like the sources of the unit cell.

In detail, in order to accomplish the above object, the method of manufacturing a flash memory device according to the embodiment of the present invention, is characterized in that it comprises the steps of sequentially forming a pad oxide film and a pad nitride film on a semiconductor substrate, forming a plurality of isolating trenches in the semiconductor substrate by means of a shallow trench isolation process using the patterned pad oxide film and the pad nitride film as an etch mask, performing a wall oxidation process and then removing the pad nitride film and the pad oxide film, forming a gap fill oxide film on the entire structure of the semiconductor substrate so that the plurality of the isolating trenches are sufficiently buried, polishing and planarizing the gap fill oxide film by means of a chemical mechanical polishing process, etching a portion of the polished gap fill oxide film to form a plurality of oxide film line patterns and a plurality of isolating cell isolation films, forming tunnel oxide films and conductive layers for a floating gate at an exposed portion of the semiconductor substrate, patterning the conductive layers for the floating gate by means of an etch process using the floating gate mask, sequentially forming a dielectric film, a conductive layer for a control gate and a hard mask layer on the entire structure including the conductive layers for the floating gate, patterning the conductive layers for the control gate by means of an etch process using a mask for the control gate, thus forming a plurality of control gates, performing a self-aligned etch process to etch exposed portions of the conductive layers for the floating gate, thus forming a plurality of floating gate, and removing exposed portions of the oxide film line patterns by means of the self-aligned source etch process and then forming a plurality of drains and a plurality of common source lines by means of a cell source/drain implantation process.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

A method of manufacturing a flash memory device using a shallow trench isolation (STI) process and a self-aligned source (SAS) etch process according to an embodiment of the present invention will be described.

Figure 1:
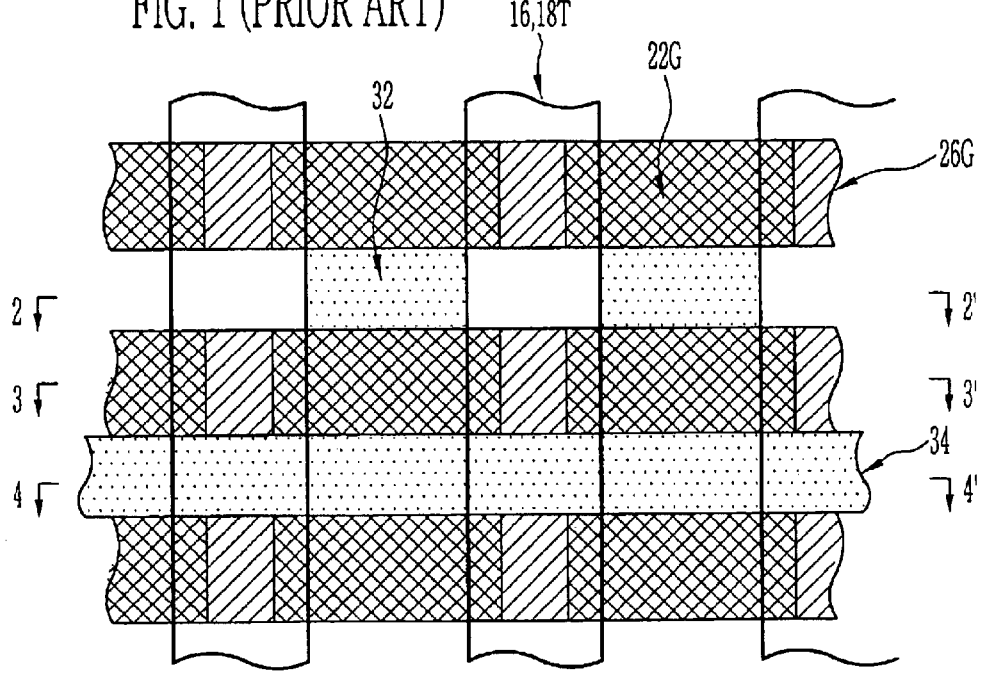
FIG. 1 is a layout diagram of a flash memory cell for explaining a conventional method of manufacturing the flash memory device.
Figure 5:
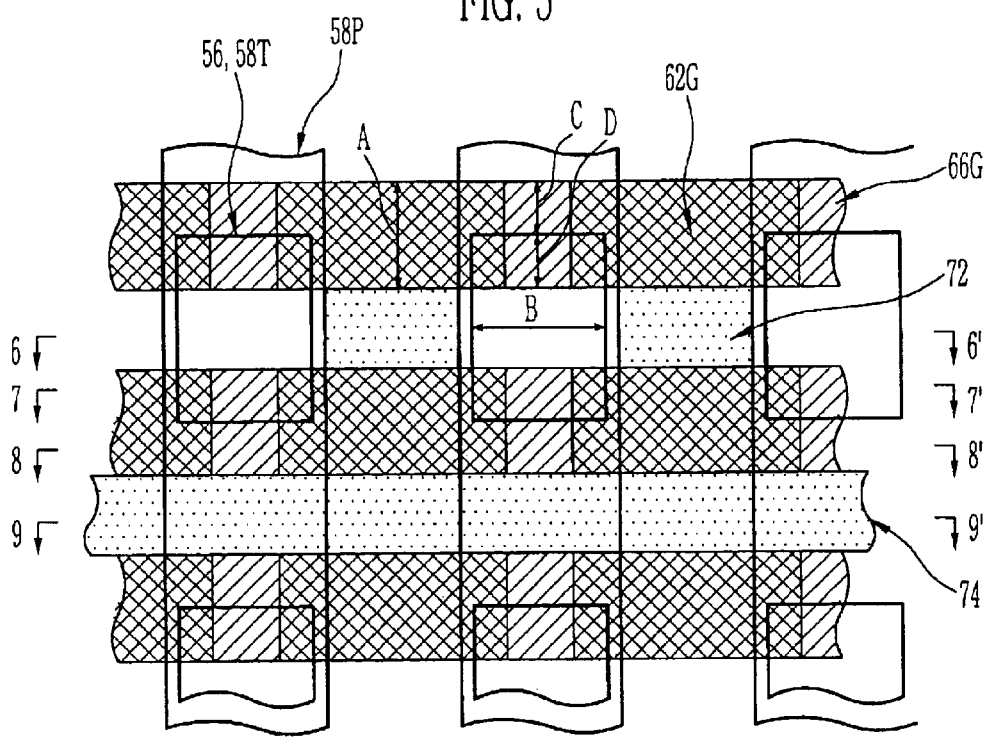
FIG. 5 is a layout diagram of a flash memory cell for explaining a method of manufacturing the flash memory device according to a preferred embodiment of the present invention.
Figure 2A:
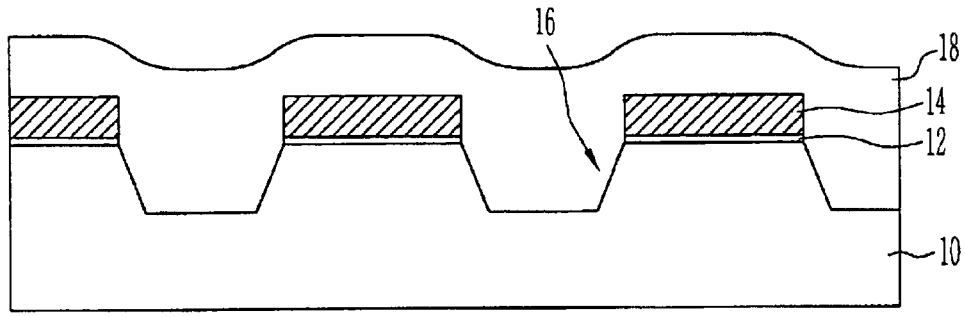
FIG. 2A through FIG. 2D are cross sectional views of the flash memory devices taken along line 2–2' in FIG. 1.
Figure 2B:
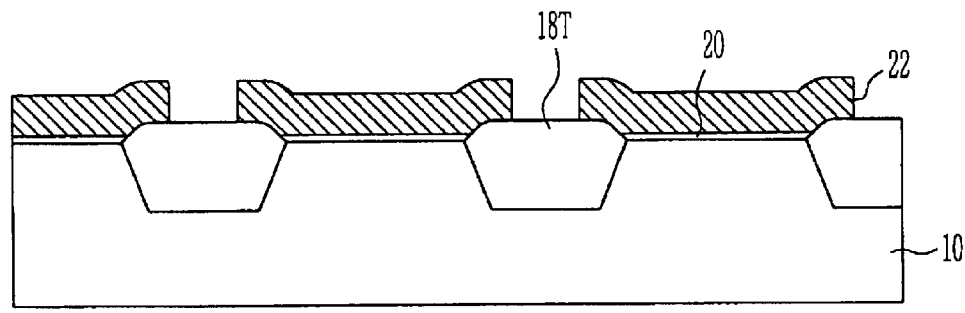
Figure 2C:
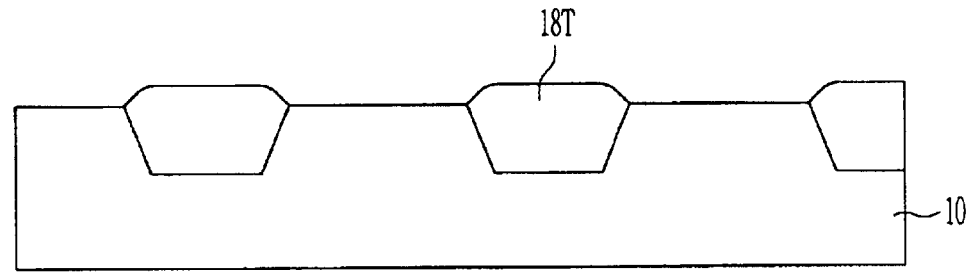
Figure 2D:
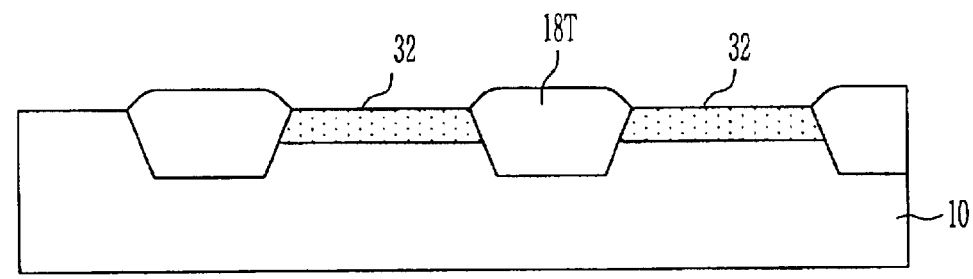
Figure 3A:
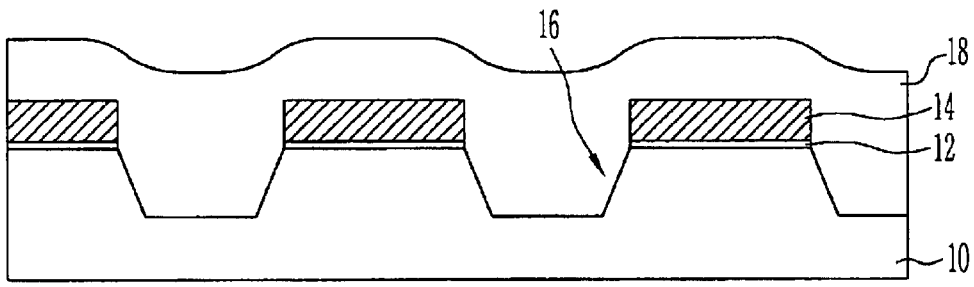
FIG. 3A through FIG. 3D are cross sectional views of the flash memory devices taken along line 3–3' in FIG. 1.
Figure 3B:
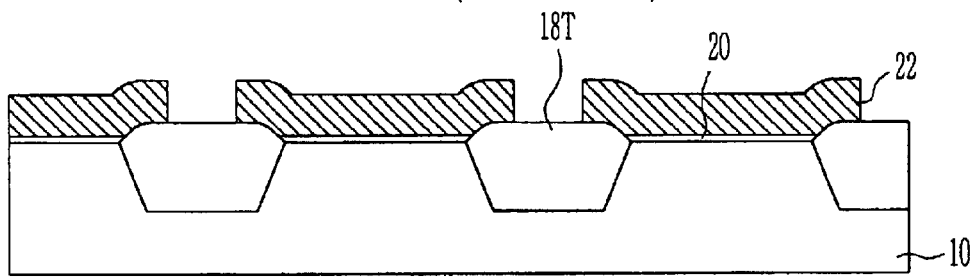
Figure 3C:
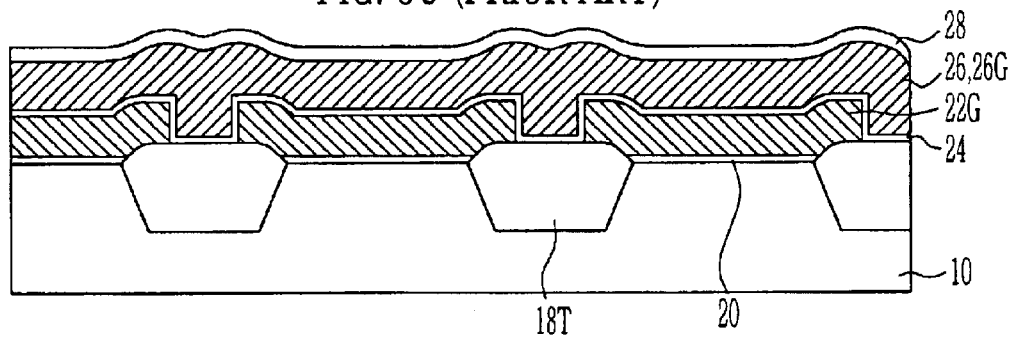
Figure 3D:
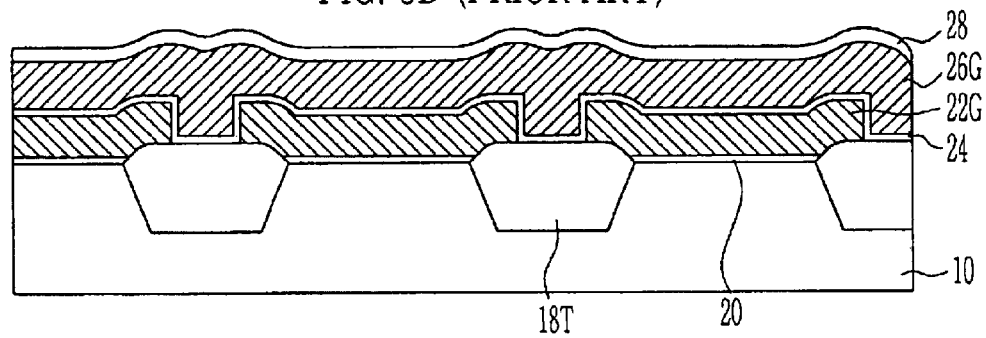
Figure 4A:
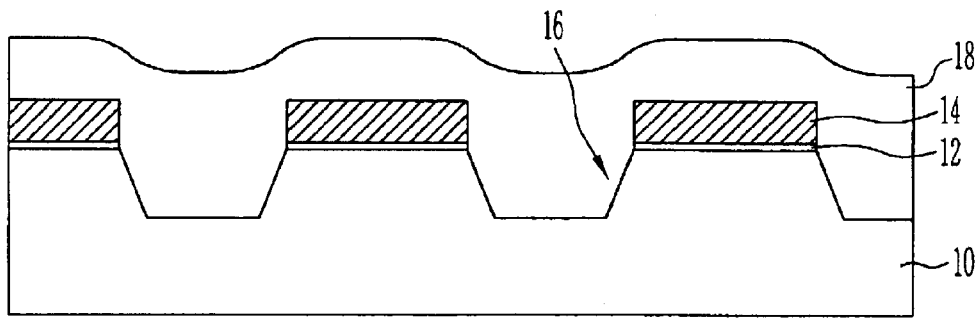
FIG. 4A through FIG. 4D are cross sectional views of the flash memory devices taken along line 4–4' in FIG. 1.
Figure 4B:
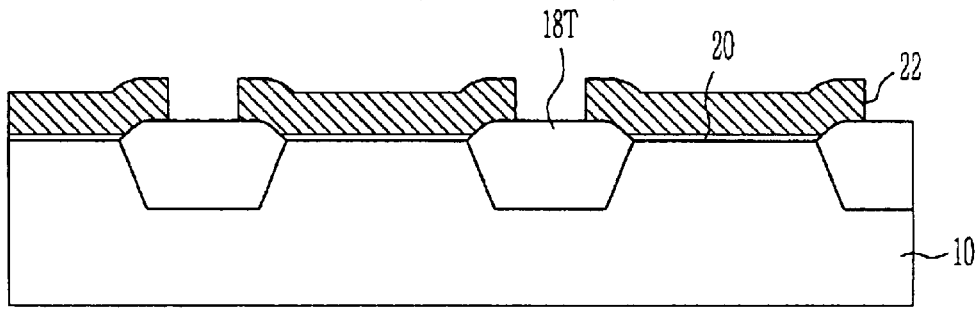
Figure 4C:
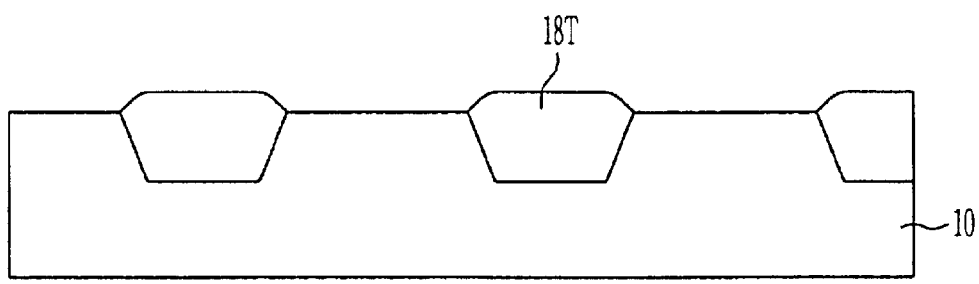
Figure 4D:
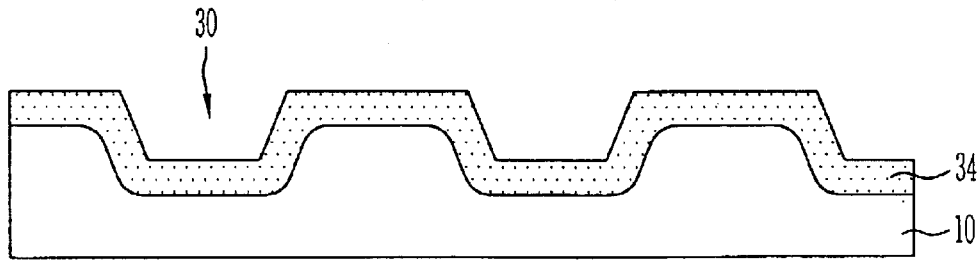
Figure 6A:
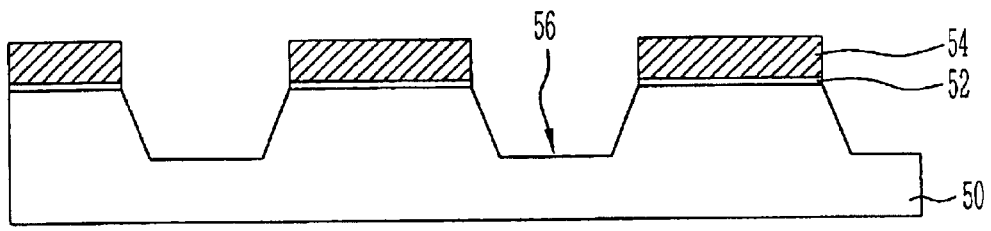
FIG. 6A through FIG. 6F cross sectional views of the flash memory devices taken along line 6–6' in FIG. 5.
Figure 6B:
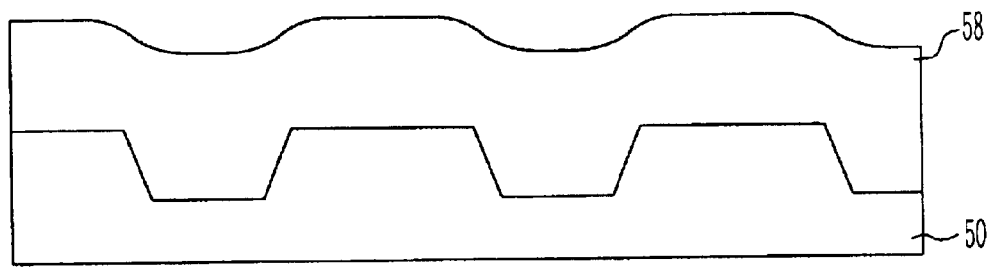
Figure 6C:
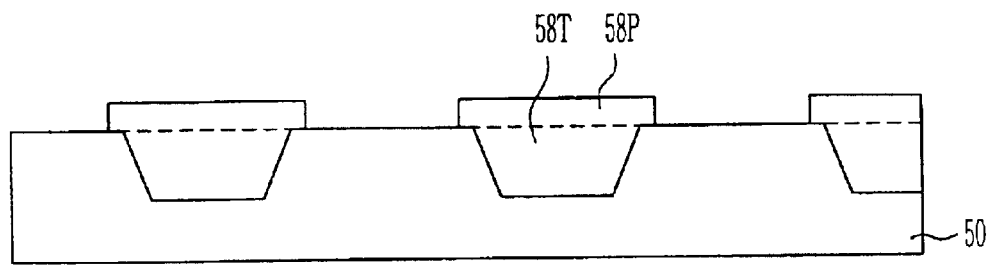
Figure 6D:
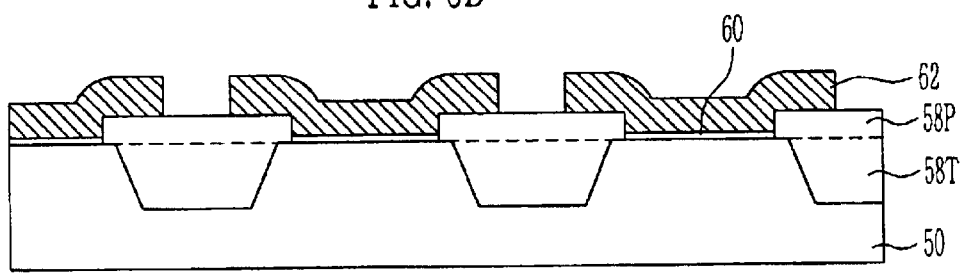
Figure 6E:
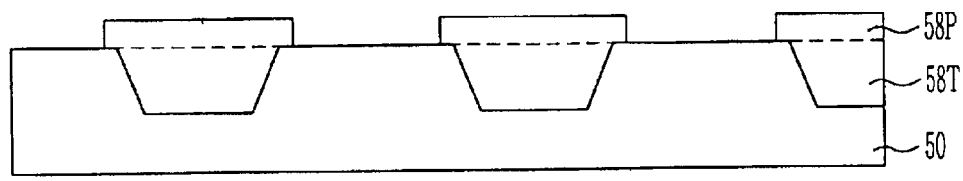
Figure 6F:
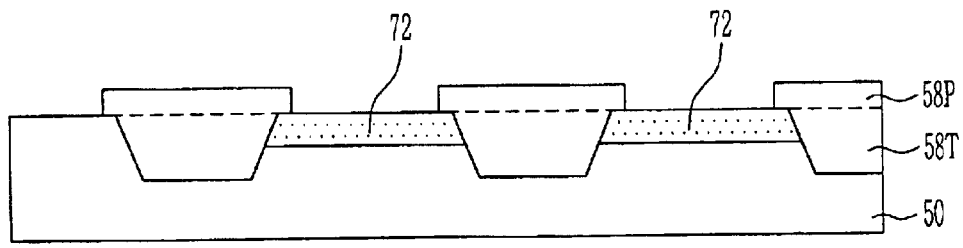
Figure 7A:
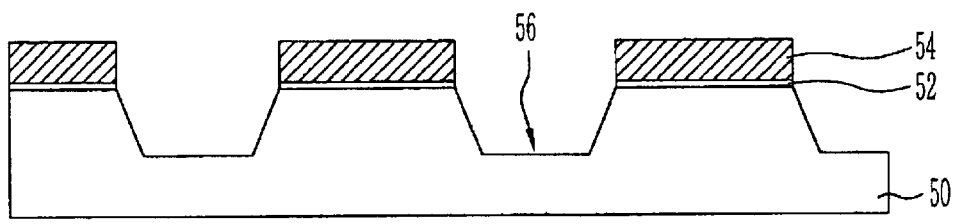
FIG. 7A through FIG. 7F cross sectional views of the flash memory devices taken along line 7–7' in FIG. 5.
Figure 7B:
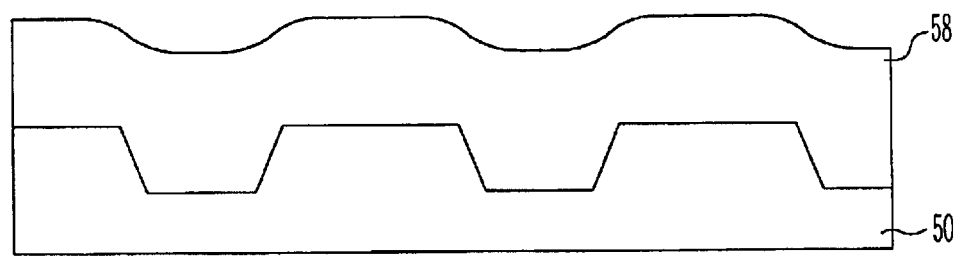
Figure 7C:
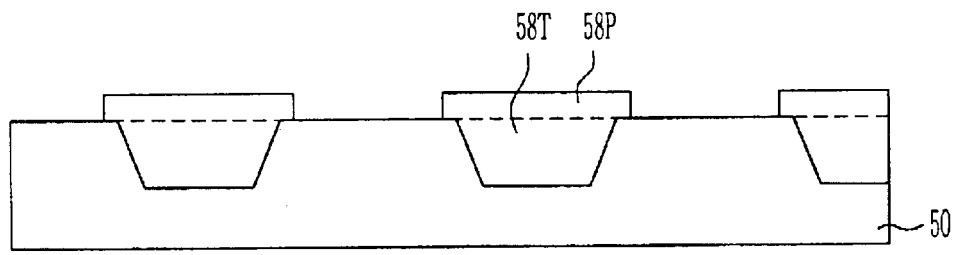
Figure 7D:
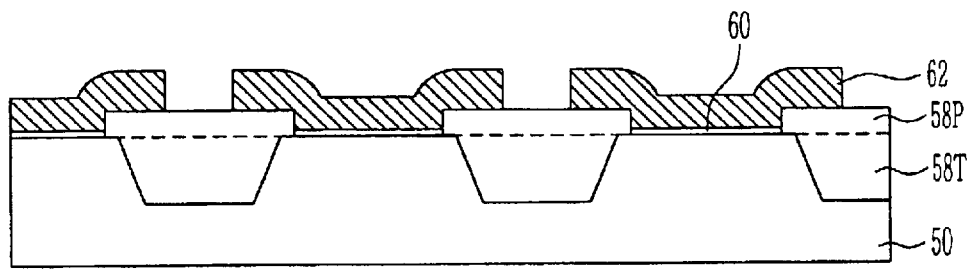
Figure 7E:
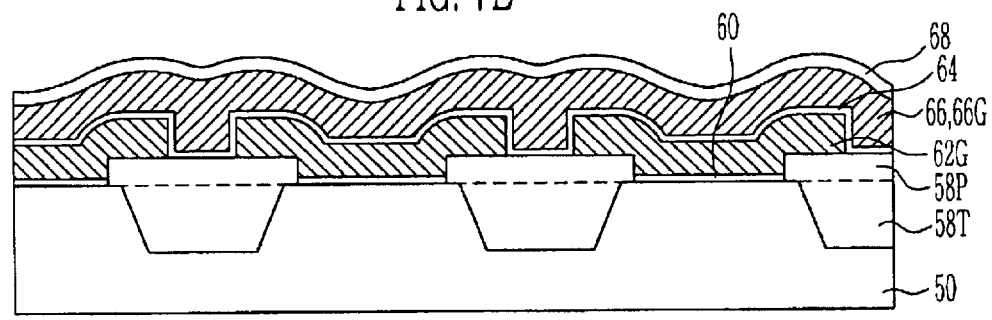
Figure 7F:
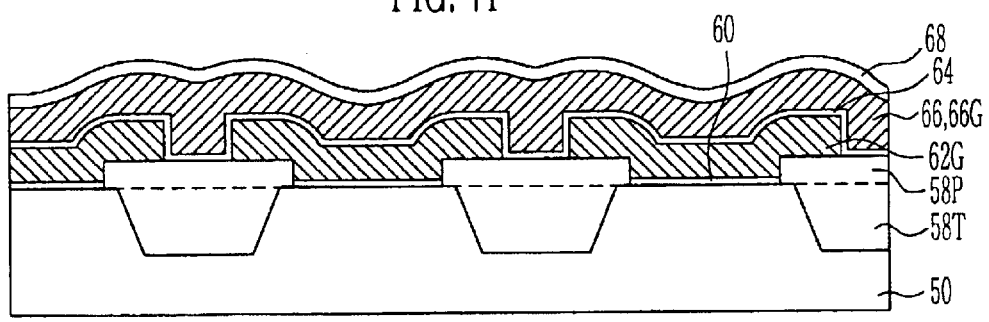
Figure 8A:
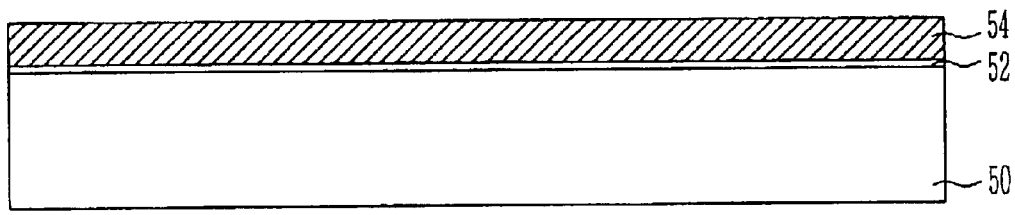
FIG. 8A through FIG. 8F cross sectional views of the flash memory devices taken along line 8–8' in FIG. 5.
Figure 8B:
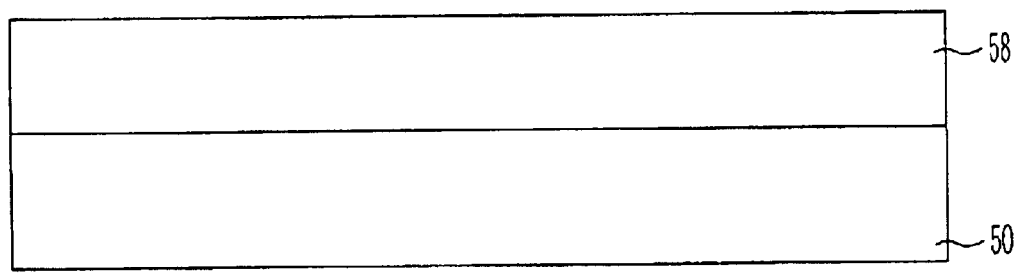
Figure 8C:
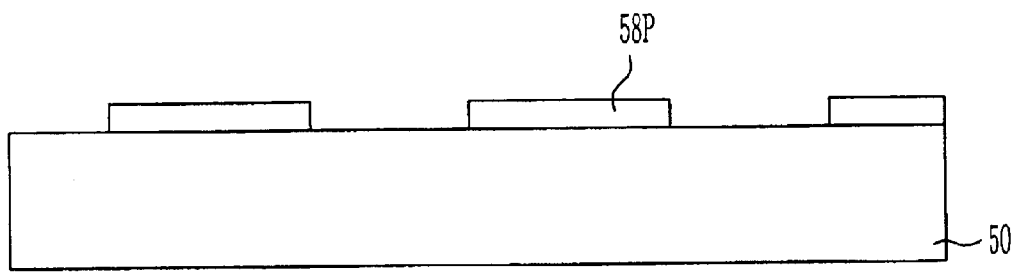
Figure 8D:
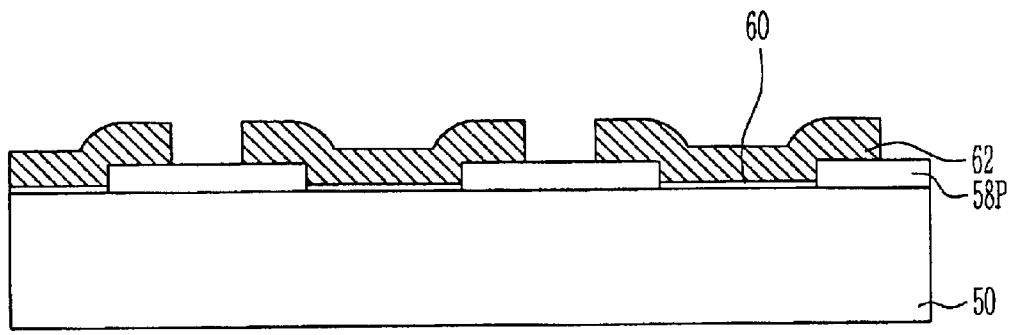
Figure 8E:
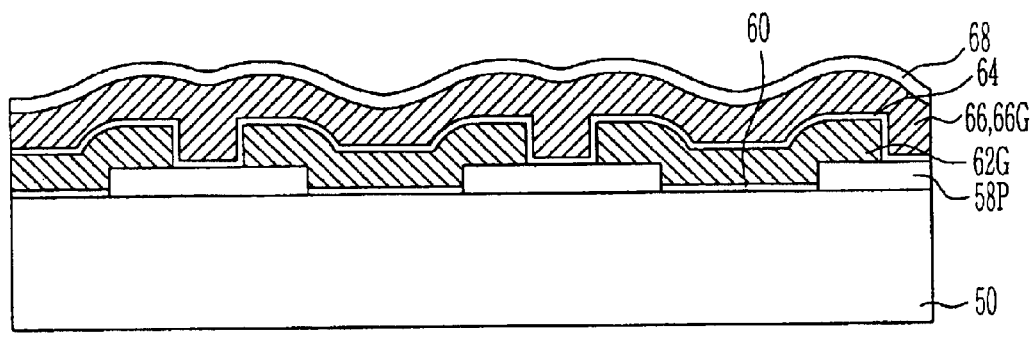
Figure 8F:
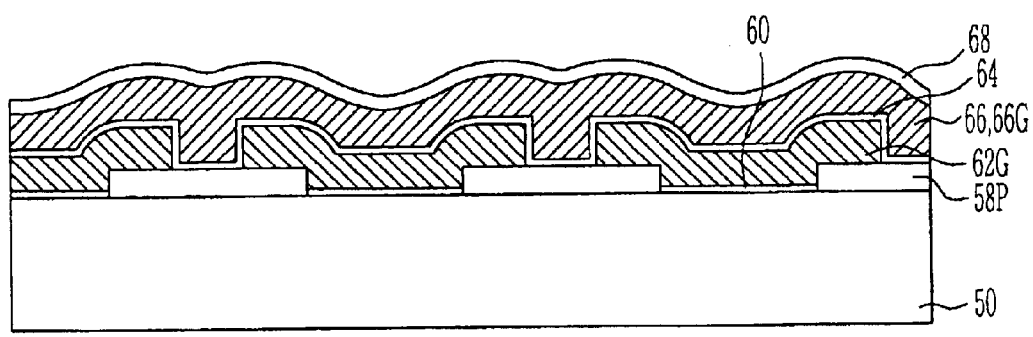
Figure 9A:
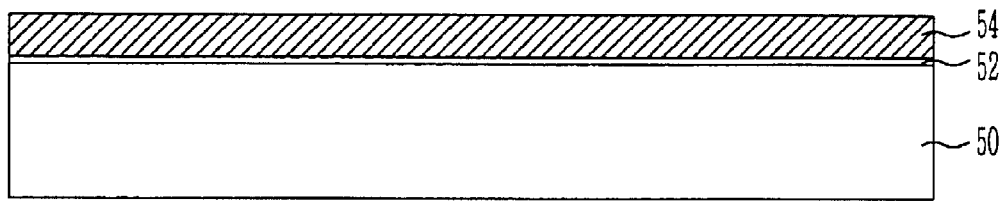
FIG. 9A through FIG. 9f cross sectional views of the flash memory devices taken along line 9–9' in FIG. 5.
Figure 9B:
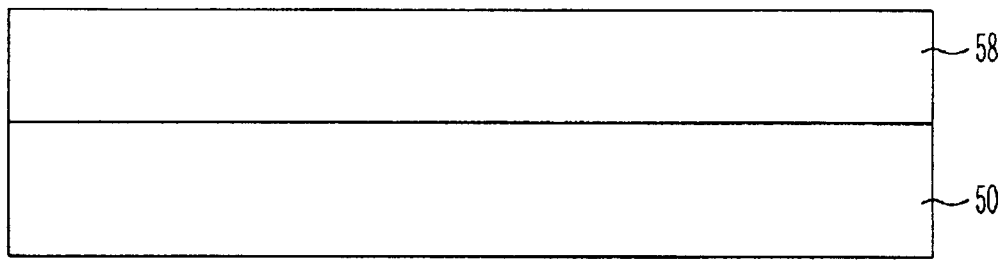
Figure 9C:
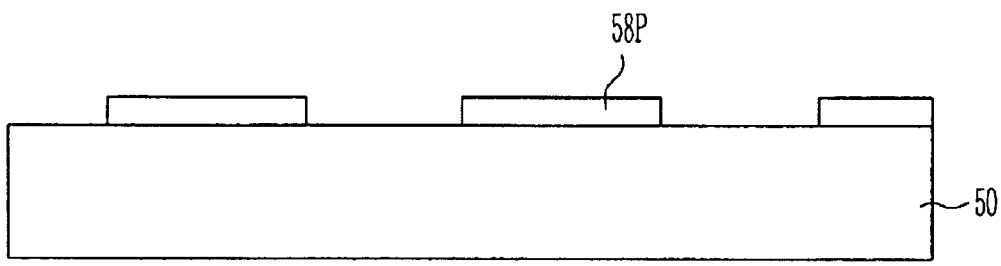
Figure 9D:
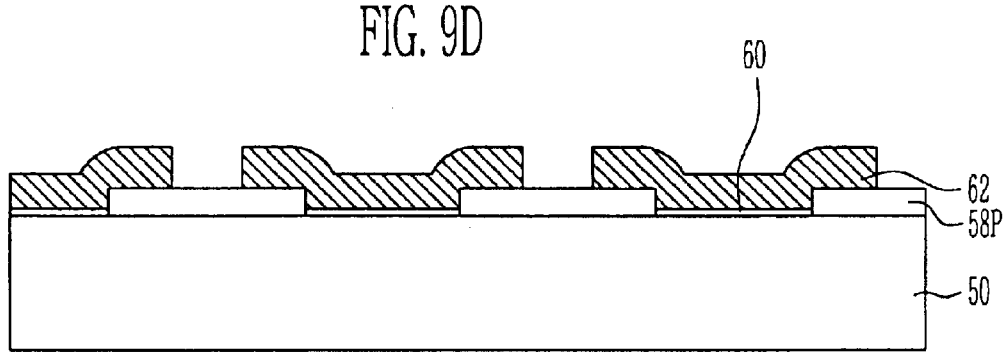
Figure 9E:
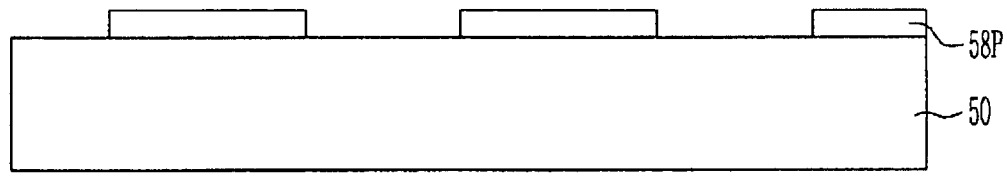
Figure 9F:
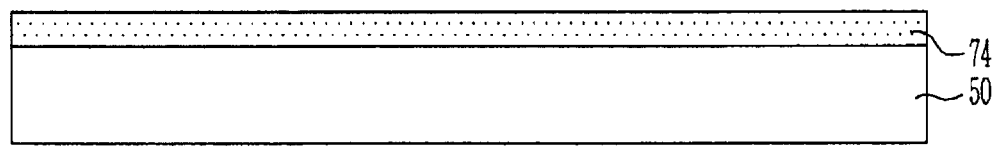

FIG. 5 is a layout diagram of a flash memory cell for explaining a method of manufacturing the flash memory device according to a preferred embodiment of the present invention, FIG. 6A through FIG. 6F cross sectional views of the flash memory devices taken along line 6–6' in FIG. 5, FIG. 7A through FIG. 7F cross sectional views of the flash memory devices taken along line 7–7' in FIG. 5, FIG. 8A through FIG. 8F cross sectional views of the flash memory devices taken along line 8–8' in FIG. 5, and FIG. 9A through FIG. 9f cross sectional views of the flash memory devices taken along line 9–9' in FIG. 5.

Referring now to FIG. 5, FIG. 6A, FIG. 7A, FIG. 8A and FIG. 9A, a pad oxide film 52 and a pad nitride film 54 are sequentially formed on a semiconductor substrate 50 and are then patterned. A plurality of isolating trenches 56 are formed in the semiconductor substrate 50 through the shallow trench isolation process using the patterned pad oxide film 52 and the pad nitride film 54 as an etch mask.

By reference to FIG. 5, FIG. 6B, FIG. 7B, FIG. 8B and FIG. 9b, after a wall oxidation process is performed, the pad nitride film 54 and the pad oxide film 52 are removed. a gap fill oxide film 58 is formed on the entire structure of the semiconductor substrate 50 so that the plurality of the isolating trenches 56 can be sufficiently buried.

Referring to FIG. 5, FIG. 6C, FIG. 7C, FIG. 8C and FIG. 9c, the gap fill oxide films 58 are planarized by a chemical mechanical polishing (CMP) process so that the thickness of the gap fill oxide films 58 from the surface of the semiconductor substrate 50 become 200 through 2000 Å. Portion of the polished and planarized gap fill oxide films 58 are etched to form a plurality of oxide film line patterns 58P and a plurality of isolating cell isolation films 58T. At this time, the isolating cell isolation films 58T and the oxide film line patterns 58P are overlapped at the isolating trenches 56.

In the above, the isolating cell isolation films 58T define active regions not only at places where a channel, a drain and a source in each of unit cells will be formed but also at places constituting the common source line between the sources and sources in each of the unit cell. The oxide film line patterns 58P is formed using a BPSG film, a LTO film, a $Si_x$ film, a TEOS film, a MTO film, a HTO film, a HDP-oxide film, or the like, all of which are a family of CVD oxide.

Referring to FIG. 5, FIG. 6D, FIG. 7D, FIG. 8D and FIG. 9d, an ion implantation process for controlling the threshold voltage and a punch blocking implantation process are performed. Tunnel oxide films 60 are then formed on the exposed portions of the semiconductor substrate 50. Next, conductive layers 62 for a floating gate are formed on the entire structure in which the tunnel oxide films 60 are formed. The conductive layers 62 for the floating gate are then etched by means of an etch process using the floating gate mask.

In the above, the tunnel oxide films 60 are formed in thickness of 50 through 200 Å. Also, the conductive layers 62 for the floating gate are formed in thickness of 300 through 3000 Å using polysilicon.

By reference to FIG. 5, FIG. 6E, FIG. 7E, FIG. 8E and FIG. 9e, a dielectric film 64, a conductive layer 66 for a control gate and a hard mask layer 68 are sequentially formed on the entire structure including the patterned conductive layers 62 for the floating gate. The conductive layer 66 for the control gate is then patterned by an etch process using a mask for a control gate. Thereby, a plurality of control gates 66G being a word line are formed in a direction intersecting the isolating cell isolation films 58T and the oxide film line patterns 58P. Next, the exposed portions of the patterned conductive layers 62 for the floating gate are etched by a self-aligned etch process. Thus, a plurality of floating gates 62G each of which exists every unit cell while overlapping with the control gate 66G are formed.

In the above, the conductive layer 66 for the control gate may be formed using polysilicon, a metal or an alloy metal such as $MOSi_x$, $TaSi_x$, TiSi, $COSi_x$, PtSi, etc.

Referring to FIG. 5, FIG. 6F FIG. 7F, FIG. 8F and FIG. 9f, the exposed portions of the oxide film line patterns 58P are removed by the self-aligned source etch process. An impurity ion is implanted into the exposed portions of the semiconductor substrate 50 by means of a cell source/drain implantation process. Thereby, a drain 72 is formed every unit cell and a common source line 74 sharing the plurality of the cells is formed.

In the above, the common source line 74 keeps a resistivity of 50 through 400 Ω/square. The common source line 74 portion between the isolating cell isolation films 58T and the neighboring isolating cell isolation films 58T is laterally diffused in the annealing process for activating the impurity ion that is performed after the cell source/drain implantation process. Due to this, the width of the common source line 74 is widen by the diffused width compared to the width of the conventional common source line having the existing trench. This does not degrade the electrical characteristic even the total width of the common source line is reduced considering the widen width. Consequently, the cell size of the flash memory device can be reduced compared to the existing flash memory device.

In the above, as the isolating cell isolation film 58T electrically isolates the unit cell and the unit cell in an isolated shape, it must be formed so that it can prevent the leakage current between the cells. In order for the isolating cell isolation film to prevent the leakage current between the cells and isolate the cells, it is required that the width 'B' of the isolating cell isolation film 58T be larger than the channel length 'A' of the floating gate 62G, the tilt angle of the sidewall of the isolating trenches 56 be 90 through 150°, preferably 90 through 120°, and the overlapped area 'D' of the control gate 66G and the isolating cell isolation film 58T is wider than the area of an portion 'C' where the common source line 74 and the isolating cell isolation film 58T are not overlapped. If the area of the overlapped portion 'D' against the area of the not-overlapped portion 'C' is represented as a percentage, it is required that the area of the overlapped portion 'D' is over 60%, preferably 60% through 110%, more preferably 60% through 90%. At this time, if the area of the overlapped portion 'D' is 100%, it means that the isolating cell isolation film 58T comes in touch with the common source line 74. If the area of the overlapped portion 'D' is 110%, it means that the isolating cell isolation film 58T is partially overlapped with the common source line 74.

As mentioned above, according to the present invention, the plurality of the isolating cell isolation films are formed by means of the shallow trench isolation process so that the active region is defined between the sources and sources in each of the unit cells. Thus, the trenches are not formed in the common source lines between the isolating cell isolation films and portions of the common source line between the isolating cell isolation films are overlapped with the word lines like in the sources of the unit cell. Therefore, the present invention has advantageous effects that it can uniformly maintain an electrical characteristic of the common source line, improve the productivity and yield of the device due to simplified process, reduce the width of the common source line and thus increase the level of integration in the semiconductor device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device, comprising the steps of:

forming a plurality of oxide film line patterns and a plurality of isolating cell isolation films in a semiconductor substrate;

forming tunnel oxide films and conductive layers for a floating gate at an exposed portion of the semiconductor substrate;

patterning the conductive layers for the floating gate;

sequentially forming a dielectric film, a conductive layer for a control gate and a hard mask layer on the entire structure including the conductive layers for the floating gate;

patterning the conductive layers for the control gate and the patterned conductive layers for the floating gate to form a plurality of control gates and a plurality of floating gates;

removing an exposed portion of the oxide film line pattern by means of a self-aligned source etch process to expose the semiconductor substrate; and forming a plurality of drains and a plurality of common source lines by means of a cell source/drain implantation process.

2. The method as claimed in claim 1, wherein the step of forming the plurality of the oxide film line patterns and the plurality of the isolating cell isolation films comprises the steps of;

sequentially forming a pad oxide film and a pad nitride film on the semiconductor substrate and then patterning the pad oxide film and the pad nitride film;

forming a plurality of isolating trenches in the semiconductor substrate by means of a shallow trench isolation process using the patterned pad oxide film and the pad nitride film as an etch mask;

performing a wall oxidization process and then removing the pad nitride film and the pad oxide film;

forming a gap fill oxide film on the entire structure of the semiconductor substrate to sufficiently bury the plurality of the isolating trenches;

polishing and planarizing the gap fill oxide film by means of a chemical mechanical polishing process; and etching a portion of the polished gap fill oxide film.

3. The method as claimed in claim 2, wherein the oxide film line pattern has a thickness of 200 through 2000 Å.

4. The method as claimed in claim 2, wherein the isolating cell isolation films and the oxide film line patterns are overlapped at the isolating trenches portion.

5. The method as claimed in claim 2, wherein the tilt angle of the sidewall of the isolating trenches is 90 through 150°.

6. The method as claimed in claim 2, wherein the oxide film line pattern is formed using any one of a BPSG film, a LTO film, a $SiN_x$ film, a TEOS film, a MTO film, a HTO film, a HDP-oxide film, all of which are a family of CVD oxide.

7. The method as claimed in claim 1, wherein after the oxide film line pattern is formed, an ion implantation process for controlling the threshold voltage and a punch blocking implantation process are performed.

8. The method as claimed in claim 1, wherein the tunnel oxide film is formed in thickness of 50 through 200 Å and the conductive layer for a floating gate is formed in thickness of 300 through 3000 Å using polysilicon.

9. The method as claimed in claim 1, wherein the control gate is formed in a direction intersecting the isolating cell isolation film and the oxide film line pattern.

10. The method as claimed in claim 1, wherein the width of the isolating cell isolation film is wider than the channel length of the floating gate.

11. The method as claimed in claim 1, wherein the conductive layer for the control gate is made of polysilicon, a metal or an alloy metal.

12. The method as claimed in claim 11, wherein the alloy metal is $MoSi_x$, $TaSi_x$, TiSi, $CoSi_x$ or PtSi.

13. The method as claimed in claim 1, wherein the common source line is formed to keep the resistivity of 50 through 400 Ω/square.

14. The method as claimed in claim 1, wherein an area of a portion where the control gate and the isolating cell isolation film are overlapped is wider than an area of a portion where the common source line and the isolating cell isolation film are not overlapped.

15. The method as claimed in claim 14, wherein the area of the overlapped portion against the area of the not-overlapped portion is 60% through 110%.

16. A method of manufacturing a flash memory device, comprising the steps of:

sequentially forming a pad oxide film and a pad nitride film on a semiconductor substrate;

forming a plurality of isolating trenches in the semiconductor substrate by means of a shallow trench isolation process using the patterned pad oxide film and the pad nitride film as an etch mask;

performing a wall oxidization process and then removing the pad nitride film and the pad oxide film;

forming a gap fill oxide film on the entire structure of the semiconductor substrate so that the plurality of the isolating trenches are sufficiently buried;

polishing and planarizing the gap fill oxide film by means of a chemical mechanical polishing process;

etching a portion of the polished gap fill oxide film to form a plurality of oxide film line patterns and a plurality of isolating cell isolation films;

forming tunnel oxide films and conductive layers for a floating gate at an exposed portion of the semiconductor substrate;

patterning the conductive layers for the floating gate by means of an etch process using the floating gate mask;

sequentially forming a dielectric film, a conductive layer for a control gate and a hard mask layer on the entire structure including the conductive layers for the floating gate;

patterning the conductive layers for the control gate by means of an etch process using a mask for the control gate, thus forming a plurality of control gates;

performing a self-aligned etch process to etch exposed portions of the conductive layers for the floating gate, thus forming a plurality of floating gate; and removing exposed portions of the oxide film line patterns by means of the self-aligned source etch process and then forming a plurality of drains and a plurality of common source lines by means of a cell source/drain implantation process.

17. The method as claimed in claim 16, wherein the oxide film line pattern has a thickness of 200 through 2000 Å.

18. The method as claimed in claim 16, wherein the isolating cell isolation films and the oxide film line patterns are overlapped at the isolating trenches portion.

19. The method as claimed in claim 16, wherein the tilt angle of the sidewall of the isolating trenches is 90 through 150°.

20. The method as claimed in claim 16, wherein the oxide film line pattern is formed using any one of a BPSG film, a LTO film, a $SiN_x$ film, a TEOS film, a MTO film, a HTO film, a HDP-oxide film, all of which are a family of CVD oxide.

21. The method as claimed in claim 16, wherein after the oxide film line pattern is formed, an ion implantation process for controlling the threshold voltage and a punch blocking implantation process are performed.

22. The method as claimed in claim 16, wherein the tunnel oxide film is formed in thickness of 50 through 200 Å and the conductive layer for a floating gate is formed in thickness of 300 through 3000 Å using polysilicon.

23. The method as claimed in claim 16, wherein the control gate is formed in a direction intersecting the isolating cell isolation film and the oxide film line pattern.

24. The method as claimed in claim 16, wherein the width of the isolating cell isolation film is wider than the channel length of the floating gate.

25. The method as claimed in claim 16, wherein the conductive layer for the control gate is made of polysilicon, a metal or an alloy metal.

26. The method as claimed in claim 25, wherein the alloy metal is $MoSi_x$, $TaSi_x$, TiSi, $CoSi_x$ or PtSi.

27. The method as claimed in claim 16, wherein the common source line is formed to keep the resistivity of 50 through 400 Ω/square.

28. The method as claimed in claim 16, wherein an area of a portion where the control gate and the isolating cell isolation film are overlapped is wider than an area of a portion where the common source line and the isolating cell isolation film are not overlapped.

29. The method as claimed in claim 28, wherein the area of the overlapped portion against the area of the not-overlapped portion is 60% through 110%.

* * * * *